(12) United States Patent
Imanishi et al.

(10) Patent No.: US 8,396,679 B2
(45) Date of Patent: Mar. 12, 2013

(54) SECONDARY CELL DEGRADATION STATE JUDGMENT SYSTEM

(75) Inventors: Tsurayoshi Imanishi, Amagasaki (JP); Shinichi Kitamura, Amagasaki (JP)

(73) Assignee: Nipron Co., Ltd., Osaka-shi (JP)

( * ) Notice: Subject to any disclaimer, the term of this patent is extended or adjusted under 35 U.S.C. 154(b) by 274 days.

(21) Appl. No.: 12/744,398

(22) PCT Filed: Nov. 26, 2008

(86) PCT No.: PCT/JP2008/071378
§ 371 (c)(1),
(2), (4) Date: May 24, 2010

(87) PCT Pub. No.: WO2009/069615
PCT Pub. Date: Jun. 4, 2009

(65) Prior Publication Data
US 2010/0256935 A1    Oct. 7, 2010

(30) Foreign Application Priority Data

Nov. 26, 2007 (JP) .................. 2007-305002

(51) Int. Cl.
*G01R 31/26* (2006.01)
*H02J 7/00* (2006.01)
(52) U.S. Cl. .......................... 702/63; 320/132
(58) Field of Classification Search .............. 702/63; 324/435; 320/132
See application file for complete search history.

(56) References Cited

U.S. PATENT DOCUMENTS

2005/0017687 A1 * 1/2005 Nagaoka ................. 320/132

FOREIGN PATENT DOCUMENTS

| JP | 2000-243459 | 9/2000 |
| JP | 2003-107139 A1 | 4/2003 |
| JP | 2005-37151 A1 | 2/2005 |
| JP | 2007-263952 A1 | 10/2007 |

OTHER PUBLICATIONS

International Search Report for International Application No. PCT/JP2008/071378 dated Feb. 24, 2009.

\* cited by examiner

*Primary Examiner* — Bryan Bui
(74) *Attorney, Agent, or Firm* — Kratz, Quintos & Hanson, LLP

(57) ABSTRACT

A secondary cell degradation state judgment system which includes: operation information measurement means (5) measuring operations information on a secondary cell (3) such as a temperature, an elapse time, a discharge depth, and a discharge capacitance of the secondary cell; degradation value calculation means (7) which calculates degradation values (15) respectively corresponding to the measurement values according to the measurement values; degradation accumulation value storage means (8) which stores degradation accumulation values (14) accumulated for each of the calculated degradation values; main accumulation value selection means (9) which selects the greatest degradation value as a main accumulation value (16) from the degradation accumulation values; and overall degradation value calculation means (10) which calculates an overall degradation value (18) according to the selected main accumulation value and a degradation value corresponding to the degradation accumulation values which have not been selected as the main accumulation value.

16 Claims, 3 Drawing Sheets

SECONDARY CELL DEGRADATION STATE JUDGMENT SYSTEM

TECHNICAL FIELD

The present invention relates to a secondary cell degradation state judgment system. More specifically, the present invention relates to the judgment of a degradation state of a secondary cell used as a backup power supply.

BACKGROUND ART

Currently, a secondary cell, such as a nickel metal hydride cell, a lithium ion cell, and a lead acid cell, is used as a backup power supply such as an uninterruptible power system (UPS), so that computers and the like can operate by the discharged energy from the secondary cell when an unexpected event such as a power failure occurs.

Such backup power supply should supply power to computers and the like even when an unexpected event occurs. In terms of a maintenance check, it is important to know the right timing to replace the secondary, and hence it is desired to accurately detect the degradation state of the secondary cell.

However, it is known that the degradation of a secondary cell is complicated and involves various factors such as the temperature, the discharge capacity, the depth of discharge, the elapsed time, the number of discharge times, and the like. It is also known that it is difficult to accurately detect the degradation state of a secondary cell.

An example of an apparatus for judging the life of a secondary cell that has been proposed is a cell life judging device disclosed in Patent Document 1.

With the cell life judging device disclosed in Patent Document 1, an expected life value is calculated based on load power applied to a secondary cell and an ambient temperature. The number of discharge times of the secondary cell is measured, and a first life reduction amount is calculated based on the measured number of discharge times. A second life reduction amount is calculated based on an average temperature of the secondary cell in a charge/discharge mode or in a standby mode, an elapsed time since installation of the secondary cell, and the ambient temperature. A remaining life is calculated by subtracting the first life reduction amount and the second life reduction amount from the expected life value.

The first life reduction amount L1 and the second life reduction amount L2 can be obtained by the following equations:

$$L_1 = a \times \ln(b \times N) + c$$

$$L_2 = d \times D \times 2^{(T_m - T_0)/10}$$

where N is the number of discharge times, D is the elapsed time, $T_m$ is the average value of temperatures of the secondary cell in a charge/discharge mode or in a standby mode as measured at certain time intervals, $T_0$ is the ambient temperature when the expected life is calculated, and a, b, c, and d are constants.

Patent Document 1: JP-A No. 2007-263952

DISCLOSURE OF THE INVENTION

Technical Problems to be Solved

Until several years ago, uninterruptible power systems had mostly been used for computers installed in a stable temperature environment such as what is called a server room and it had not been necessary to strictly consider use thereof in a severe environment. However, in accordance with the widespread use of computers, the need for data protection and continuous operations has increased common awareness of the need for backup power supplies, and so, backup power supplies are now commonly used. Consequently, the backup power supplies are now used in various environments.

In Patent Document 1, an ambient temperature, the number of discharge times, an average temperature, and an elapsed time are measured, and based on the measured data, a remaining life value is calculated. However, the widespread use of uninterruptible power systems involves use under a high temperature environment. In such a severe installation environment, an actual degradation state sometimes shows a significant deviation from an expected degradation value.

In consideration of the problem described above, an object of the present invention is to provide a secondary cell degradation state judgment system with which a degradation state can be judged in various environments.

Means to Solve the Problems

A secondary cell degradation state judgment system according to the present invention includes:

operation information measurement means for measuring operations information on a secondary cell, the operations information including at least two out of a group of items including a temperature of the secondary cell, one of date of manufacture and an elapsed time since installation, a depth of discharge, and a discharge capacity;

degradation value calculation means for calculating degradation values of the secondary cell respectively corresponding to at least two measurement values measured by the operation information measurement means, based on the measurement values;

degradation accumulation value storage means for storing degradation accumulation values obtained by respectively accumulating the degradation values calculated by the degradation value calculation means;

main accumulation value selection means for selecting a greatest degradation accumulation value out of at least two of the degradation accumulation values accumulated by the degradation accumulation value storage means as a main accumulation value; and overall degradation value calculation means for calculating an overall degradation value based on the main accumulation value selected by the degradation accumulation value selection means and the degradation value corresponding to the degradation accumulation value not selected as the main accumulation value.

Accordingly, the degradation accumulation values are respectively stored based on a plurality of operations information on the secondary cell, and the greatest degradation accumulation value among them is set as the main accumulation value. That is, the data showing the greatest factor of the degradation can be reflected in the judgment of the degradation state. Further, because the other degradation factor(s) is/are also reflected in the judgment of the degradation state, the degradation state can be more accurately judged.

The overall degradation value calculation means may add up the main accumulation value and the degradation value corresponding to the degradation accumulation value not selected as the main accumulation value.

The secondary cell degradation state judgment system may further include data table storage means for storing a data table associating the measurement values measured by the operation information measurement means with the degradation values of the secondary cell, wherein the degradation value calculation means may calculate the degradation values based on the data table stored in the data table storage means.

The secondary cell may be any of a nickel metal hydride cell, a lithium ion secondary cell, and a nickel-cadmium secondary cell.

The secondary cell may be accommodated in one of a housing of a computer and a control device of the computer.

Effect of the Invention

In the secondary cell degradation state judgment system according to the present invention structured as above, degradation accumulation values are respectively stored based on a plurality of operations information on the secondary cell, and the greatest degradation accumulation value among them is set as the main accumulation value. That is, the data showing the greatest factor of the degradation can be reflected in the judgment of the degradation state. Further, because the other degradation factor(s) is/are also reflected in the judgment of the degradation state, the degradation state can be judged more accurately as compared to a case where the degradation state is judged based on one piece of measurement data.

Further, because the calculation is not simply carried out based on a plurality of measurement values, but instead, is carried out by selecting the data of the main accumulation value that affects the degradation the greatest, the degradation state can be judged in accordance with various operating environments of the secondary cell.

Still further, because the sum of the degradation value(s) not selected as the main accumulation value is added to the main accumulation value to obtain the overall degradation value, the degradation factor(s) not selected as the main accumulation value can also be reflected in the judgment of the degradation state.

Still further, the provision of the data table makes it possible to dispense with a calculation unit that performs higher-level operational processing, and to implement a cost-effective degradation state judgment system.

Still further, when a nickel metal hydride cell, a lithium ion secondary cell, or a nickel-cadmium secondary cell is selected as the secondary cell, a global, environmentally conscious backup power supply can be implemented as compared to a case where a lead-acid cell is selected.

Still further, because the secondary cell is installed inside the housing or the control device of the computer, it is not necessary to provide an installation space for the backup power supply. Still further, even in an environment where temperatures or discharge frequencies are varied, such as inside a housing of the computer, the judgment can be carried out appropriately in accordance with the installation environment or state of use because the greatest degradation accumulation value is set as the main accumulation value to judge the degradation state.

BRIEF DESCRIPTION OF REFERENCE NUMERALS

Figure 1:
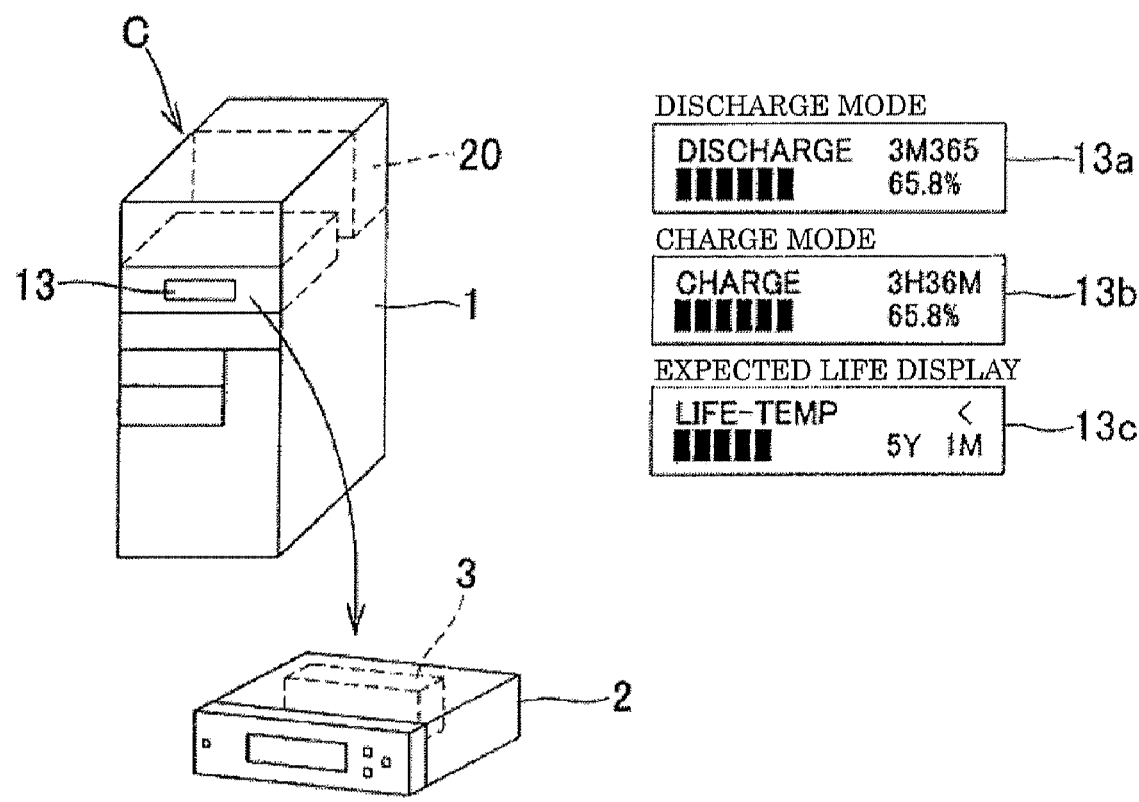
FIG. 1 is an explanatory diagram of a backup power supply installed in a housing of a computer.

1 Housing
2 Control device
3 Secondary cell
4 Degradation state judgment system
5 Operation information measurement means
5a Temperature measurement unit
5b Elapsed time measurement unit
5c Depth of discharge measurement unit
5d Discharge capacity measurement unit
6 Data table storage means
7 Degradation value calculation means
7a Temperature degradation value calculation unit
7b Elapsed time degradation value calculation unit
7c Depth of discharge degradation value calculation unit
7d Discharge capacity degradation value calculation unit
8 Degradation accumulation value storage means
8a Temperature degradation accumulation value storage unit
8b Elapsed time degradation accumulation value storage unit
8c Depth of discharge degradation accumulation value storage unit
8d Discharge capacity degradation value storage unit
9 Main accumulation value selection means
10 Overall degradation value calculation means
11 Degradation state judgment means
12 Degradation state report means
13 Display unit
14 Degradation accumulation values
14a Temperature degradation accumulation value
14b Elapsed time degradation accumulation value
14c Depth of discharge degradation accumulation value
14d Discharge capacity degradation accumulation value
15 Degradation values
15a Temperature degradation value
15b Elapsed time degradation value
15c Depth of discharge degradation value
15d Discharge capacity degradation value
16 Main accumulation value
17 Sub degradation value
18 Overall degradation value
19 Judgment criterion
20 Power supply device
21 Communication unit
22 Speaker
C Computer

BEST MODE FOR CARRYING OUT THE INVENTION

As shown in FIG. 1, a secondary cell degradation state judgment system according to the present invention includes, inside a housing 1 of a computer C, a control device 2 that accommodates a secondary cell 3, and is configured to display charge states 13b and 13c, and a degradation state (remaining life state) 13a on a display unit 13.

The control device 2 accommodates the secondary cell 3 inside a casing of the control device 2. The secondary cell 3 can be charged by power supplied from a power supply device 20 of the computer C, and discharges power to the power supply device 20 when a power failure occurs, to function as a backup power supply.

The secondary cell 3 is a nickel metal hydride cell which is environmentally advantageous, i.e., which is more environmentally conscious as compared to, for example, a lead-acid cell. While a nickel metal hydride cell is used herein as the secondary cell 3, various types of secondary cell such as a lithium ion secondary cell, a nickel-cadmium secondary cell, and the like may be used.

As shown in FIG. 1, because the secondary cell 3 is accommodated inside the housing 1 of the computer C, it is not necessary to provide an installation space for an uninterruptible power system.

Alternatively, the secondary cell 3 may be accommodated in a device other than the housing 1 so as not to be affected by the heat generated inside the computer C, thereby suppressing degradation of the secondary cell 3 caused by the temperature.

Figure 2:
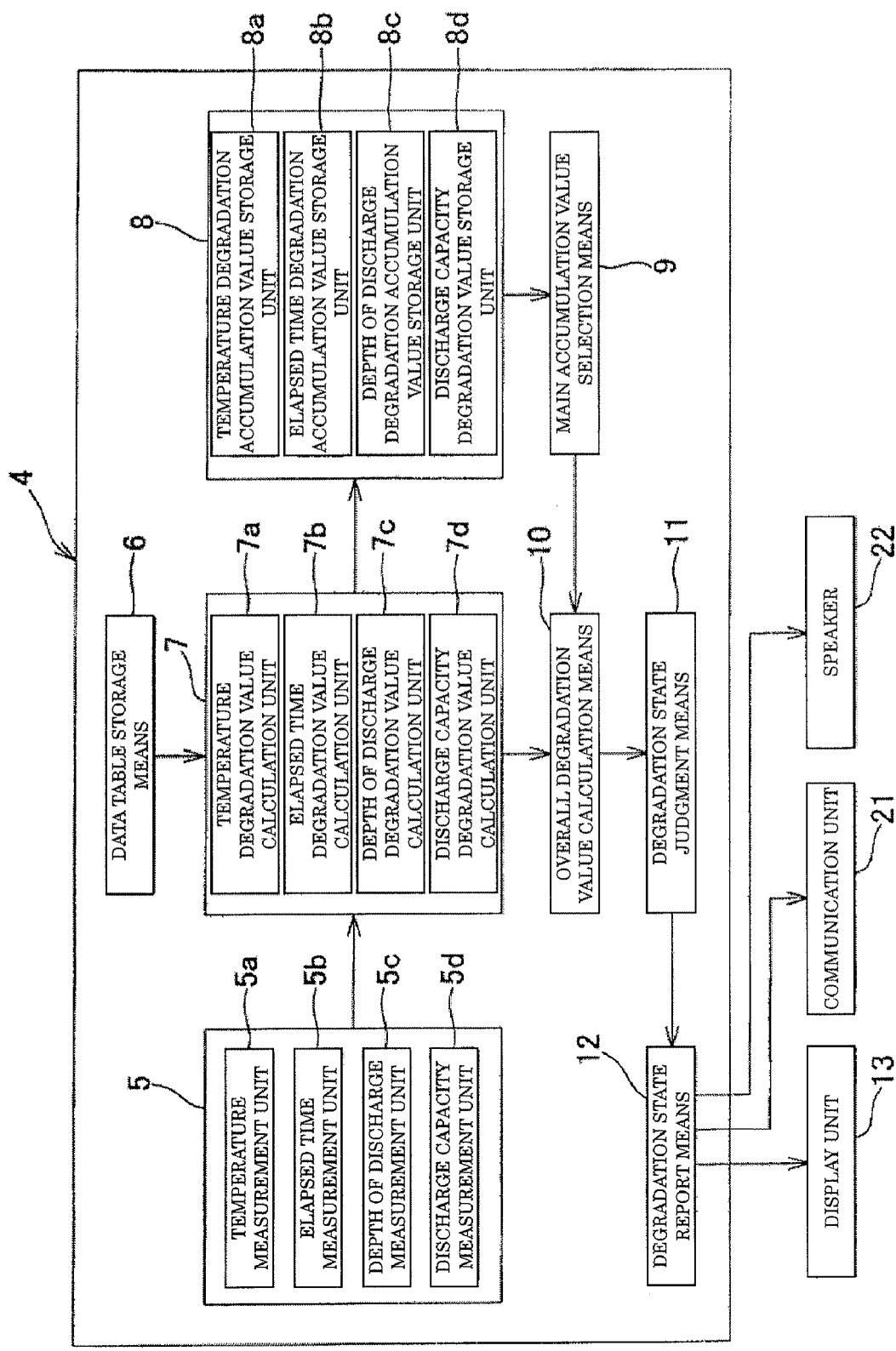
FIG. 2 is a block diagram of a secondary cell degradation state judgment system.

As shown in FIG. 2, a secondary cell degradation state judgment system 4 includes operation information measurement means 5, data table storage means 6, degradation value calculation means 7, degradation accumulation value storage means 8, main accumulation value selection means 9, overall degradation value calculation means 10, degradation state judgment means 11, and degradation state report means 12.

The operation information measurement means 5 measures operations information on the secondary cell 3, which is constituted of the temperature of the secondary cell 3, the elapsed time since the date of manufacture, the depth of discharge, the discharge capacity, and the like.

The operation information measurement means 5 includes a temperature measurement unit 5a that measures the current temperature of the secondary cell, an elapsed time measurement unit 5b that measures an elapsed time since the date of manufacture of the secondary cell 3, a depth of discharge measurement unit 5c that measures the depth of discharge of the secondary cell 3, and a discharge capacity measurement unit 5d that measures the discharge capacity of the secondary cell 3.

The elapsed time measurement unit 5b measures the elapsed time based on date of manufacture information that is stored in the secondary cell 3. On the other hand, it may measure the elapsed time since the secondary cell 3 was set in the control device 2.

In the present embodiment, while four pieces of operations information, i.e., the temperature, the elapsed time, the depth of discharge, and the discharge capacity, are measured, measurement of at least two pieces of operations information will suffice. The greater the number of pieces of measured operations information, the higher the judgment accuracy of the degradation state.

The data table storage means 6 stores a data table in which the measurement values measured by the operation information measurement means 5 and degradation values are associated with each other. The data table is constituted of a temperature data table, an elapsed time data table, a depth of discharge data table, and a discharge capacity data table.

The degradation value calculation means 7 is constituted of a temperature degradation value calculation unit 7a, an elapsed time degradation value calculation unit 7b, a depth of discharge degradation value calculation unit 7c, and a discharge capacity degradation value calculation unit 7d, and configured to calculate, upon reception of the measurement signals indicative of the temperature, the elapsed time, the depth of discharge, and the discharge capacity respectively measured by the measurement units 5a, 5b, 5c, and 5d of the operation information measurement means 5, a temperature degradation value, an elapsed time degradation value, a depth of discharge degradation value, and a discharge capacity degradation value, for respective received measurement values.

In such a case where the data table storage means 6 is provided, the degradation values are calculated based on the data tables. Alternatively, any calculation formula for calculating the degradation values from the measurement values may be stored in advance, so as to calculate the degradation values based on that calculation formula.

The provision of the data table makes it possible to dispense with a calculation unit that performs higher-level operational processing, and to structure a cost-effective degradation state judgment system.

The degradation accumulation value storage means 8 is constituted of a temperature degradation accumulation value storage unit 8a, an elapsed time degradation accumulation value storage unit 8b, a depth of discharge degradation accumulation value storage unit 8c, and a discharge capacity degradation accumulation value storage unit 8d, and is configured to accumulate the degradation values respectively calculated by the degradation value calculation units 7a, 7b, 7c, and 7d of the degradation value calculation means 7, for respective degradation values and store them.

The main accumulation value selection means 9 selects the greatest degradation accumulation value as a main accumulation value out of the degradation accumulation values stored in the degradation accumulation value storage means 8. The accumulation values that are not selected as the main accumulation value are set as sub accumulation values.

The overall degradation value calculation means 10 calculates an overall degradation value based on the main accumulation value selected by the main accumulation value selection means 9 and the degradation values (hereinafter referred to as the "sub degradation values") corresponding to the other accumulation values not selected as the main accumulation value (hereinafter referred to as the "sub accumulation values").

One exemplary calculation of the overall degradation value may be to add up the main accumulation value and all of the sub degradation values, as will be described later referring to FIG. 3.

The degradation state judgment means 11 judges the current degradation state based on the overall degradation value calculated by the overall degradation value calculation means 10 and a preset judgment criterion. It may be possible to display each piece of operations information measured by the operation information measurement means 5 on the display unit 13.

The degradation state report means 12 is configured to report the judgment result from the degradation state judgment means 11, and may be configured to display the judgment result on the display unit 13, to emit an alert sound or the like from a speaker 22, and/or to externally transmit various types of signal such as an alert signal from a communication unit 21.

Figure 3:
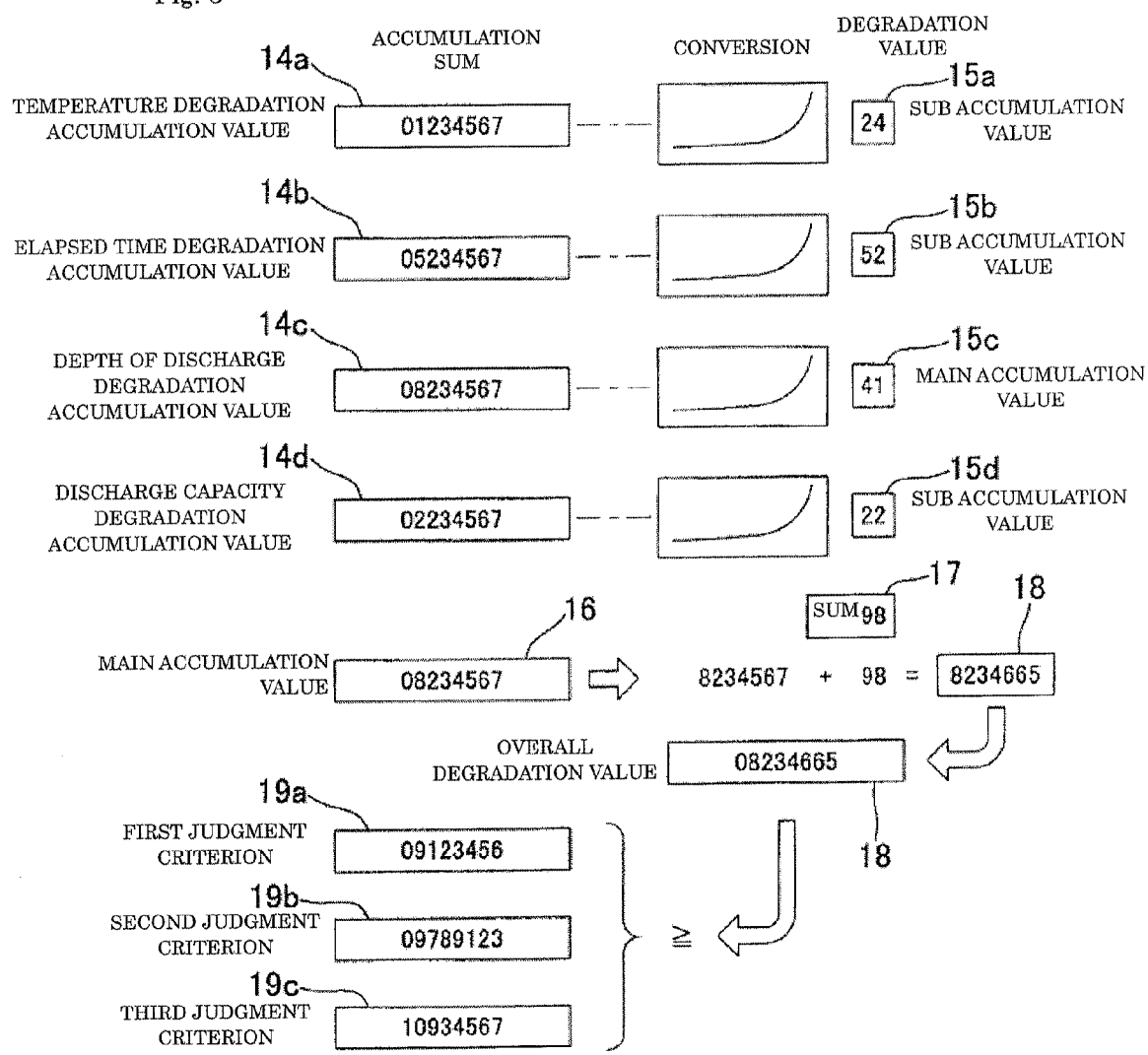
FIG. 3 is an explanatory diagram about the judgment of the degradation state of a secondary cell.

Next, referring to FIGS. 2 and 3, a description is given of a specific example of judging the degradation state of the secondary cell 3.

First, the measurement units 5a to 5d of the operation information measurement means 5 respectively measure the temperature, the elapsed time, the depth of discharge, and the discharge capacity. The measured pieces of data are calculated by the degradation value calculation units 7a to 7d of the degradation value calculation means 7 to obtain a temperature degradation value 15a, an elapsed time degradation value 15b, a depth of discharge degradation value 15c, and a discharge capacity degradation value 15d. FIG. 3 illustrates that the temperature degradation value 15a is calculated to be "24", the elapsed time degradation value 15b being calculated to be "52", the depth of discharge degradation value 15c being calculated to be "41", and the discharge capacity degradation value 15d being calculated to be "22".

Further, the degradation accumulation value storage means accumulates the degradation values 15a to 15d, and stores a temperature degradation accumulation value 14a, an elapsed time degradation accumulation value 14b, a depth of discharge degradation accumulation value 14c, and a discharge capacity degradation accumulation value 14d. FIG. 3 illustrates that the temperature degradation accumulation value 14a is stored as "01234567", the elapsed time degradation accumulation value 14b being stored as "05234567", the depth of discharge degradation accumulation value 14c being stored as "08234567", and the discharge capacity degradation accumulation value 14d being stored as "02234567". Every time the degradation values 15 are calculated, the calculated degradation values 15 are respectively added to the degradation accumulation values 14.

The main accumulation value selection means 9 selects the greatest degradation accumulation value as the main accumulation value out of the degradation accumulation values stored in the degradation accumulation value storage units 8a to 8d. In FIG. 3, because the accumulation value of the depth of discharge degradation accumulation value 14c is the greatest, the depth of discharge degradation accumulation value 14c is set as the main accumulation value, and the other ones of the temperature degradation accumulation value 14a, the elapsed time degradation accumulation value 14b, and the discharge capacity degradation accumulation value 14d are set as the sub degradation values.

Upon selection of the main accumulation value, the overall degradation value calculation means 10 selects the degradation values that correspond to the sub accumulation values, and adds them to the main accumulation value. In FIG. 3, the temperature degradation value 15a "24", the elapsed time degradation value 15b "52", and the discharge capacity degradation value 15d "22" are selected to obtain a sub degradation value 17 "98". The sub degradation value 17 and the main accumulation value 14c "08234567" are added up to obtain "8234665", which is an overall degradation value 18.

Then, by the degradation state judgment means 11, the current degradation state is judged based on the overall degradation value 18 and a preset judgment criterion. The judgment scheme may be, as shown in FIG. 3, to store a single judgment criterion or a plurality of judgment criteria 19 (19a, 19b, 19c) in advance in order to compare the judgment criterion/criteria 19 with the overall degradation value 18 to judge whether the overall degradation value 18 exceeds the judgment criterion/criteria 19.

Then, the degradation state report means 12 displays the judgment result from the degradation state judgment means 11 on the display unit 13. Though the displaying of the degradation state may simply be carried out by displaying just the calculated overall degradation value, an expected life calculation unit configured to calculate the expected life of the secondary cell 3 is provided herein, so as to calculate the expected life value of the secondary cell 3, which is then converted into time and displayed as shown on the display unit 13c in FIG. 1.

It is noted that, when the degradation state judgment means 11 judges that the overall degradation value surpasses the judgment criteria 19, illumination of the display unit 13 may be caused to blink, the speaker 22 may be caused to emit an alert sound, or the communication unit 21 may be caused to externally output an alert signal to report that replacement of the secondary cell 3 is imminent.

In the exemplary case described above, while the depth of discharge degradation accumulation value 14c is the greatest and therefore the degradation accumulation value is selected as the main accumulation value, the same holds true for the other degradation accumulation values, i.e., the temperature degradation accumulation value 14a, the elapsed time degradation accumulation value 14b, and the discharge capacity degradation accumulation value 14d.

In this manner, by selecting the factor that affects the degradation the greatest out of the plurality of degradation factors of the secondary cell 3, the main factor of the degradation is specified. Specifically, in FIG. 3, the degradation due to the depth of discharge is recognized as the most affecting degradation factor, and the degradation state is determined.

For example, if the secondary cell 3 has been installed in a high temperature environment for a long time, even if it has a weak discharge, the numerical value of the temperature degradation accumulation value 14a becomes higher than the other accumulation values 14b, 14c and 14d. In such a case, the temperature degradation accumulation value 14a may be set as the main accumulation value, such that it is greatly reflected in the judgment of the degradation.

Further, the degradation values corresponding to the sub accumulation values are added up to obtain the sub degradation value 17. Then, from the sub degradation value 17 and the main accumulation value 16, the overall degradation value 18 is obtained. Hence, the effect by the other degradation factors can be also reflected in the judgment of the degradation.

In particular, when the secondary cell 3 is installed inside the housing of the computer, an installation space for the backup power supply is not necessary. Even in other environment where temperatures or discharge frequencies are varied such as inside the housing of the computer, the judgment can be carried out appropriately in accordance with the installation environment or state of use because the greatest degradation accumulation value is set as the main accumulation value to judge the degradation state.

It is noted that while it has been described that all the degradation values corresponding to the sub accumulation values are simply added up, they may be multiplied by respective coefficients preset in accordance with the order of the sub accumulation values, to obtain the sub degradation value 17.

The invention claimed is:

1. A secondary cell degradation state judgment system, comprising:
    operation information measurement means for measuring operations information on a secondary cell, the operations information including at least two out of a group of items including a temperature of the secondary cell, one of date of manufacture and an elapsed time since installation, a depth of discharge, and a discharge capacity;
    degradation value calculation means for calculating degradation values of the secondary cell respectively corresponding to at least two measurement values measured by the operation information measurement means, based on the measurement values;
    degradation accumulation value storage means for storing degradation accumulation values obtained by respectively accumulating the degradation values calculated by the degradation value calculation means;
    main accumulation value selection means, operably coupled to the degradation accumulation value storage means, for selecting a greatest degradation accumulation value out of at least two of the degradation accumulation values accumulated by the degradation accumulation value storage means as a main accumulation value; and
    overall degradation value calculation means for calculating an overall degradation value based on the main accumulation value selected by the degradation accumulation value selection means and the degradation value corresponding to the degradation accumulation value not selected as the main accumulation value.

2. The secondary cell degradation state judgment system according to claim 1, wherein
the overall degradation value calculation means adds up to the main accumulation value and the degradation value corresponding to the degradation accumulation value not selected as the main accumulation value.

3. The secondary cell degradation state judgment system according to claim 2, further comprising:
data table storage means for storing a data table associating the measurement values measured by the operation information measurement means with the degradation values of the secondary cell, wherein
the degradation value calculation means calculates the degradation values based on the data table stored in the data table storage means.

4. The secondary cell degradation state judgment system according to claim 3, wherein
the secondary cell is any of a nickel metal hydride cell, a lithium ion secondary cell, and a nickel-cadmium secondary cell.

5. The secondary cell degradation state judgment system according to claim 4, wherein
the secondary cell is accommodated in one of a housing of a computer and a control device of the computer.

6. The secondary cell degradation state judgment system according to claim 1, further comprising:
data table storage means for storing a data table associating the measurement values measured by the operation information measurement means with the degradation values of the secondary cell, within
the degradation value calculation means calculates the degradation values based on the data table stored in the data table storage means.

7. The secondary cell degradation state judgment system according to claim 6, wherein
the secondary cell is any of a nickel metal hydride cell, a lithium ion secondary cell, and a nickel-cadmium secondary cell.

8. The secondary cell degradation state judgment according to claim 7, wherein
the secondary cell is accommodated in one of a housing of a computer and a control device of the computer.

9. The secondary cell degradation state judgment system according to claim 1, wherein
the secondary cell is any of a nickel metal hydride cell, a lithium ion secondary cell, and a nickel-cadmium secondary cell.

10. The secondary cell degradation state judgment system according to claim 9, wherein
the secondary cell is accommodated in one of a housing of a computer and a control device of the computer.

11. The secondary cell degradation state judgment system according to claim 2, wherein
the secondary cell is any of a nickel metal hydride cell, a lithium ion secondary cell, and a nickel-cadmium secondary cell.

12. The secondary cell degradation state judgment system according to claim 11, wherein
the secondary cell is accommodated in one of a housing of a computer and a control device of the computer.

13. The secondary cell degradation state judgment system according to claim 1, wherein
the secondary cell is accommodated in one of a housing of a computer and a control device of the computer.

14. The secondary cell degradation state judgment system according to claim 2, wherein
the secondary cell is accommodated in one of a housing of a computer and a control device of the computer.

15. The secondary cell degradation state judgment system according to claim 3, wherein
the secondary cell is accommodated in one of a housing of a computer and a control device of the computer.

16. The secondary cell degradation state judgment system according to claim 4, wherein
the secondary cell is accommodated in one of a housing of a computer and a control device of the computer.

* * * * *